(12) United States Patent
Matsuda (10) Patent No.: US 7,087,957 B2
(45) Date of Patent: Aug. 8, 2006

(54) SEMICONDUCTOR DEVICE AND MANUFACTURING METHOD OF THE SAME

(75) Inventor: Hajime Matsuda, Yamanashi (JP)

(73) Assignee: Eudyna Devices, Inc., Yamanishi (JP)

( * ) Notice: Subject to any disclaimer, the term of this patent is extended or adjusted under 35 U.S.C. 154(b) by 0 days.

(21) Appl. No.: 11/034,920

(22) Filed: Jan. 14, 2005

(65) Prior Publication Data

US 2005/0189584 A1 Sep. 1, 2005

(30) Foreign Application Priority Data

Jan. 16, 2004 (JP) .............................. 2004-009877

(51) Int. Cl.
*H01L 29/76* (2006.01)
*H01L 29/94* (2006.01)

(52) U.S. Cl. ...................... 257/330; 257/392

(58) Field of Classification Search ................. None
See application file for complete search history.

(56) References Cited

U.S. PATENT DOCUMENTS 4,733,283 A * 3/1988 Kuroda ........................ 257/195
5,021,857 A * 6/1991 Suehiro ........................ 257/392

FOREIGN PATENT DOCUMENTS

JP 5-13464 1/1993

OTHER PUBLICATIONS

H. Tosaka et al., "An Antenna Switch MMIC using E/D Mode p-HEMT for GSM/DCS/PCS/WCDMA Bands Application", 2003 IEEE MTT-S Digest, IFTU-50, pp. 5-8.

* cited by examiner

*Primary Examiner*—Tu-Tu Ho
(74) *Attorney, Agent, or Firm*—Westerman, Hattori, Daniels & Adrian, LLP (57) ABSTRACT

A semiconductor device includes a compound semiconductor substrate, a channel layer provided on the compound semiconductor substrate, a buried layer provided on the channel layer, a first recess formed in the buried layer in an E-mode region, a second recess formed in the first recess in the E-mode region and another second recess formed in the buried layer in a D-mode region, and a gate electrode provided in the second recess in the E-mode region and another gate electrode provided in the second recess in the D-mode region, and a distance between a surface of the buried layer and a bottom of the second recess in the E-mode region is shorter than another distance between another surface of the buried layer and a bottom of said another second recess in the D-mode region.

6 Claims, 9 Drawing Sheets

FIG. 1

PRIOR ART

FIG. 2

PRIOR ART

FIG. 10A
OFF

SEMICONDUCTOR DEVICE AND MANUFACTURING METHOD OF THE SAME

BACKGROUND OF THE INVENTION

1. Field of the Invention

This invention generally relates to semiconductor devices and the manufacturing method of the same, and more particularly, to field effect semiconductor devices and the manufacturing method of the same. Specifically, the present invention relates to a compound semiconductor device including an enhancement mode FET (hereinafter referred to as E-mode FET) and a depletion mode FET (hereinafter referred to as D-mode FET) and the manufacturing method of the same. In particular, the present invention relates to semiconductor devices mounted on radio frequency (RF) devices that handle several hundreds of MHz or more such as mobile telephones.

2. Description of the Related Art

Conventionally, an E-mode region and a D-mode region are arranged on a single compound semiconductor substrate formed by epitaxial growth. The E-mode FET (Field Effect Transistor) has a normally "off" characteristic and the D-mode transistor has a normally "on" characteristic. That is, the E-mode has a positive threshold voltage Vth at the time a drain current starts flowing. In contrast, the D-mode has a negative threshold voltage. It is possible to downsize radio frequency circuits and improve the characteristics, by fabricating transistors having the above-mentioned different modes on the single compound semiconductor substrate. For example, a switching device can be realized which has, on a single chip, a switch and a logic circuit for controlling the switch. In this case, the E-mode FET may be used in the logic circuit, and the D-mode FET may be used in the switch.

Figure 1:
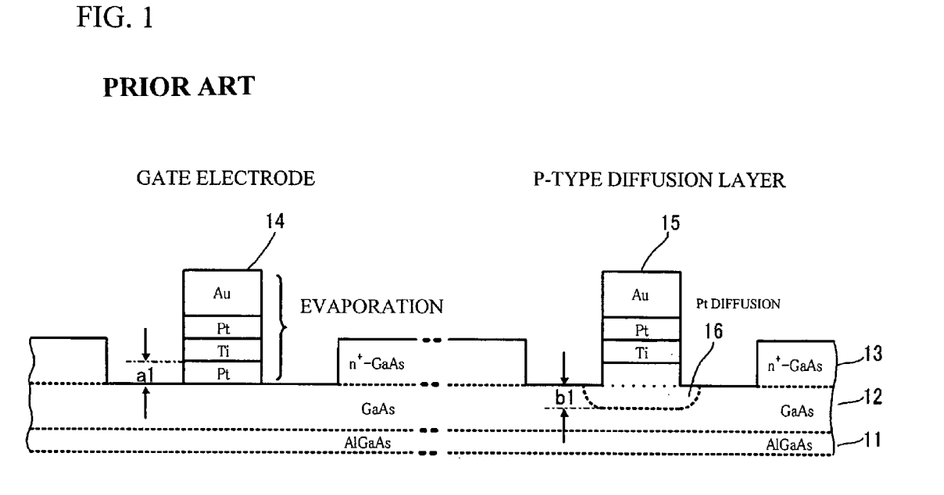
FIG. 1 is a cross-sectional view of a gate electrode and a p-type diffusion layer of a compound semiconductor device disclosed in a conventional technique.

FIG. 1 is a cross-sectional view of a gate electrode and a p-type diffusion layer of the compound semiconductor device described in H. Tosaka, et al., "An antenna Switch MMIC using E/D-mode p-HEMT for GSM/DCS/PCS/WCDMA Bands Application", 2003 IEEE MTT-S Digest, IFTU-50, pp. 5–8 (hereinafter referred to as Document 1). The compound semiconductor device described in Document 1 is a HEMT (High Electron Mobility Transistor). A gate electrode 14 on the left shown in FIG. 1 is fabricated by evaporating Au/Pt/Ti/Pt on a GaAs layer 12. A p-type diffusion layer 16 on the right is formed by diffusing Pt in the GaAs layer 12 below the gate electrode 14. The E-mode region and the D-mode region are arranged on the same compound semiconductor substrate by controlling a thickness b1 of the p-type diffusion layer.

Figure 2:
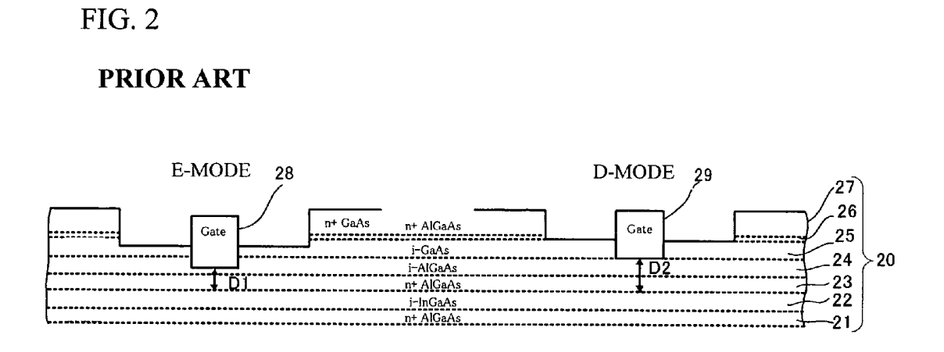
FIG. 2 is a cross-sectional view of the compound semiconductor device disclosed in another conventional technique.

FIG. 2 is a cross-sectional view of the compound semiconductor device disclosed in Japanese Patent Application Publication No. 5-13464 (hereinafter referred to as Document 2). The compound semiconductor device described in Document 2 is a HEMT. The E-mode region and the D-mode region are arranged on the same compound semiconductor substrate by varying a distance from a Schottky interface of the gate to a channel layer. A compound semiconductor layer 20 is formed on the compound semiconductor substrate by the epitaxial growth. The compound semiconductor layer 20 includes a supply layer 21 of $n^+$-AlGaAs, a channel layer 22 of i-InGaAs, a supply layer 23 of $n^+$-AlGaAs, a barrier layer 24 of i-AlGaAs, a buried layer 25 of i-GaAs, an etching stopper layer 26 of $n^+$-AlGaAs, and a cap layer 27 of $n^+$-GaAs. Gate electrodes 28 and 29 have recess structures and are embedded in compound semiconductor layers 24 and 25. A distance D1 is shorter than a distance D2 (D1<D2). The distance D1 is from the Schottky interface of the gate electrode 28 in an E-type transistor to the channel layer 22. The distance D2 is from the Schottky interface of the gate electrode 29 in the D-mode region to the channel layer 22.

The conventional techniques shown in FIGS. 1 and 2, however, have the following drawbacks.

The conventional technique shown in FIG. 1 has a drawback in controlling the threshold voltage Vth(E) of the E-mode transistor. This threshold voltage Vth(E) varies according to the thickness b1 of the p-type diffusion layer 16. However, the p-type impurities such as Pt or Zn have large diffusion coefficients. Therefore, the thickness b1 varies according to the thermal history in the fabrication process. It is extremely difficult to control the threshold voltage Vth(E) at a constant value due to the variation of the thickness b1. The thickness b1 of the p-type diffusion layer 16 also varies according to the thickness a1 of the evaporated Pt film that forms the lowermost layer of the gate electrode 15. According to Document 1, a slight variation of the evaporated film thickness a1 causes a wide variation of the threshold voltage Vth(E). The controllability of the threshold value Vth(E) is not sufficient. Therefore, it is difficult to separately fabricate transistors having a Vth(D) of −0.2 V and a Vth(E) of +0.2 V on the single compound semiconductor substrate in which Vth(D) is small and the difference between Vth(D) and Vth(E) is also small.

Figure 3:
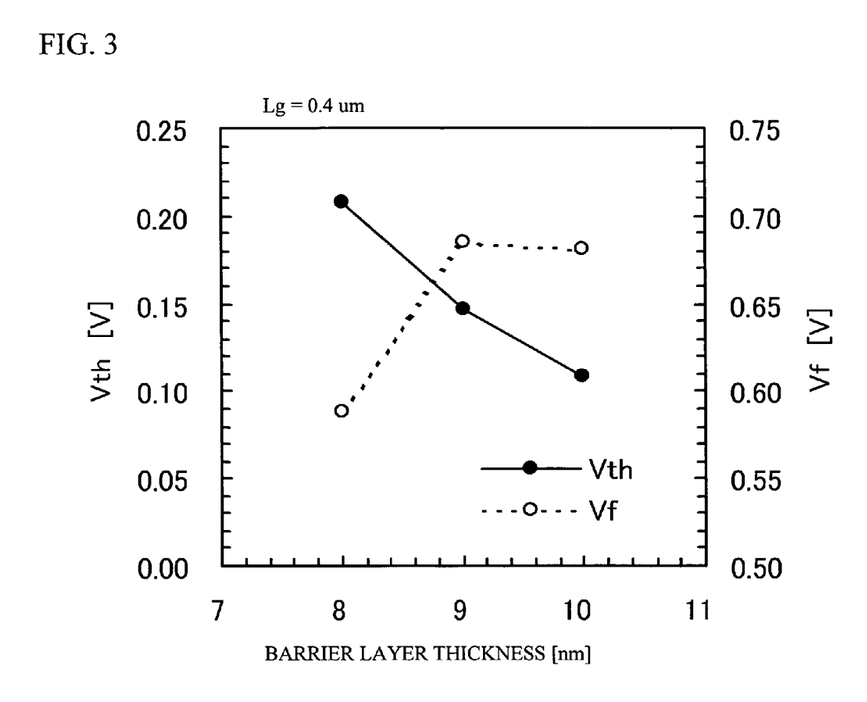
FIG. 3 shows drawbacks of the conventional compound semiconductor device.

It is necessary to make the distance D1 thin in order to achieve the E-mode with the conventional technique shown in FIG. 2. The distance D1 corresponds to the sum of the thickness of the barrier layer 24 and that of the supply layer 23. However, if the distance D1 becomes smaller than a certain value, the forward Schottky diode characteristics of the gate electrode 28 are drastically degraded. FIG. 3 shows the above-mentioned drawback. The horizontal axis in FIG. 3 denotes the thickness of the barrier layer 24, and one vertical axis on the left denotes the threshold value Vth[V] of the E-mode FET. The other vertical axis on the right denotes a forward voltage drop Vf[V]. A gate length Lg of the gate electrode 28 is equal to 0.4 μm. As seen in experiment results in FIG. 3, as the barrier layer 24 becomes thinner, the threshold voltage becomes greater and the E-mode can be achieved. However, in the case where the thickness of the barrier layer 24 is nine nanometers or less, the forward voltage drop Vf drastically drops. If the supply layer 23 requires 11 nanometers in thickness in order to hold the D-mode characteristics, the E-mode having the Vth of 0.2 V cannot be achieved without setting the barrier layer 24 to be six nanometers in thickness. In fact, excellent forward Schottky diode characteristics cannot be obtained with the barrier layer 24 of six nanometers. Besides, there is another drawback in that it is difficult to control the thickness of the barrier layer 24 accurately with etching.

SUMMARY OF THE INVENTION

It is a general object of the present invention to solve the above-mentioned drawbacks and provide a compound semiconductor device having a new structure and manufacturing method of the same.

A more specific object of the present invention is to provide the compound semiconductor device having a compound semiconductor substrate, on which the E-mode threshold voltage and D-mode threshold voltage can be realized.

According to an aspect of the present invention, preferably, there is provided a semiconductor device includes a compound semiconductor substrate, a channel layer provided on the compound semiconductor substrate, a buried layer provided on the channel layer, a first recess formed in the buried layer in an E-mode region, a second recess formed in the first recess in the E-mode region and another second recess formed in the buried layer in a D-mode region, and a gate electrode provided in the second recess in the E-mode region and another gate electrode provided in the second recess in the D-mode region, and a distance between a surface of the buried layer and a bottom of the second recess in the E-mode region is shorter than another distance between another surface of the buried layer and a bottom of said another second recess in the D-mode region. It is thus possible to form two different threshold voltages in the E-mode region and in the D-mode region on a single compound substrate.

On the above-mentioned semiconductor device, preferably, a distance between the bottom of the second recess and the channel layer in the E-mode region is identical to another distance between the bottom of said another second recess and the channel layer in the D-mode region.

On the above-mentioned semiconductor device, preferably, the first recess in the E-mode region is deeper than said another first recess in the D-mode region.

On the above-mentioned semiconductor device, preferably, the semiconductor device may further include a supply layer provided on the channel layer, the supply layer forming a two-dimensional electron gas in the channel layer.

On the above-mentioned semiconductor device, preferably, the semiconductor device may further include an RF switch circuit and a logic circuit, the RF switch circuit using an FET in the D-mode region, and the logic circuit including another FET in the E-mode region.

On the above-mentioned semiconductor device, preferably, the semiconductor device may further include an RF switch circuit and a power amplifier circuit, the RF switch circuit using an FET in the D-mode region, and the power amplifier circuit including another FET in the E-mode region.

On the above-mentioned semiconductor device, preferably, an FET in the E-mode region has a higher breakdown voltage between a gate and drain than another breakdown voltage between a gate and drain in the D-mode region.

On the above-mentioned semiconductor device, preferably, the semiconductor device may further include a cap layer provided on the buried layer in the D-mode region, wherein a third recess is formed in the cap layer, and said another second recess is formed in the third recess.

According to another aspect of the present invention, preferably, there is provided a manufacturing method of a semiconductor device includes the steps of providing a channel layer on a compound semiconductor device, providing a buried layer on the channel layer, forming a first recess in an E-mode region and another first recess in a D-mode region, by etching the buried layer, forming a second recess in the first recess in the E-mode region and another second recess in said first recess in the D-mode region, and forming a gate electrode in a second recess in the E-mode region and another gate electrode in another second recess in the D-mode region, and a distance between a bottom of the first recess and another bottom of the second recess in the E-mode region is shorter than another distance between yet another bottom of the first recess and still another bottom of the second recess in the D-mode region.

On the above-mentioned manufacturing method of the semiconductor device, the method may further include the step of arranging a supply layer on the channel layer, the supply layer forming a two-dimensional electron gas in the channel layer.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

(First Embodiment)

Figure 4:
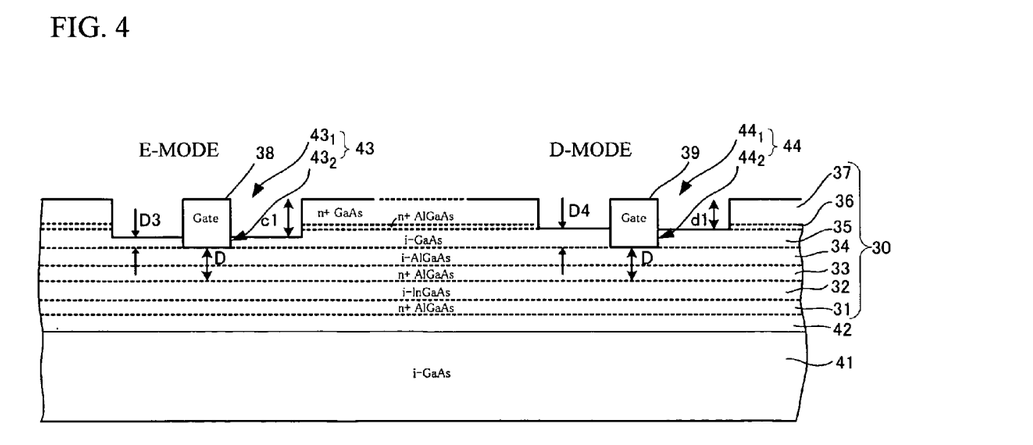
FIG. 4 is a cross-sectional view of a compound semiconductor device in accordance with a first embodiment of the present invention.

FIG. 4 is a cross-sectional view of a compound semiconductor device in accordance with a first embodiment of the present invention. This compound semiconductor device is a HEMT having a single compound semiconductor substrate on which the E-mode and D-mode are achieved. A compound semiconductor layer 30 is formed by epitaxial growth. The compound semiconductor layer 30 includes a supply layer 31 of $n^+$-AlGaAs, a channel layer 32 of i-InGaAs, another supply layer 33 of $n^+$-AlGaAs, a barrier layer 34 of i-AlGaAs, a buried layer 35 of i-GaAs, an etching stopper layer 36 of $n^+$-AlGaAs, and a cap layer 37 of $n^+$-GaAs. For instance, Si is an impurity of the supply layer 31 and the cap layer 37. The supply layers 31 and 33 supply the channel layer with a two-dimensional electron gas. The compound semiconductor layer 30 is provided on a buffer layer 42. The buffer layer 42 is provided on a compound semiconductor substrate 41. That is to say, the supply layer 31 is epitaxially grown on the buffer layer 42.

The gate electrode 38 is provided in the E-mode region, and the gate electrode 39 is provided in the D-mode region. The gate electrodes 38 and 39 have recess structures. That is, the gate electrode 38 is provided in a recess 43, and the gate electrode 39 is provided in a recess 44. The recess 43 includes a first recess $43_1$ and a second recess $43_2$. The first recess $43_1$ in the E-mode region is formed in the cap layer 37 and the etching stopper layer 36. The second recess $43_2$ formed in the first recess $43_1$ is provided in the buried layer 35. The first recess $43_1$ is provided in the cap layer 37, the etching stopper layer 36, and the buried layer 35. The first recess $44_1$ in the D-mode region is provided in the cap layer 37 and the etching stopper layer 36. The second recess $44_2$ provided in the first recess $44_1$ is formed in the buried layer 35. The gate electrodes 38 and 39 are embedded in the compound semiconductor layer 30 as follows. A distance D is from the Schottky interface of the gate electrode 38 (the bottom of the gate electrode 38 and the interface of the barrier layer 34) to the channel (the surface of the channel layer 32). The other distance D is from the Schottky interface of the gate electrode 39 to the channel. Two distances Ds are identical. In other words, in both recesses 43 and 44, the respective distances from the bottom of the second recess $43_2$ and $44_2$ to the channel layer 32 are identical. A distance D3 from the surface of the buried layer 35 under the recess 43 is shorter than a distance D4 from the surface of the buried layer 35 to the barrier layer 34 under the recess 44 (D3<D4). That is, the distance D3 between the bottom of the first recess $43_1$ and the bottom of the second recess $43_2$ in the recess 43 in the E-mode region is shorter than the distance D4 between the bottom of the first recess $44_1$ and the bottom of the second recess $44_2$ in the recess 44 in the D-mode region. The bottom of the first recess $43_1$ is the surface of the buried layer 35. The bottom of the second recess $43_2$ is the surface of the buried layer 35. In other words, a depth c1 of the first recess $43_1$ in the recess 43 is greater than a depth d1 of the first recess $44_1$ in the recess 44. The distances D3 and D4 respectively correspond to the thickness of the buried layer 35 in the recesses 43 and 44. In this way, the distances from the Schottky interfaces to the channels are identical in both modes. The threshold voltage Vth(D) of the D-mode and the threshold voltage Vth(E) of E-mode are determined by changing the distance from the bottom of the recess $43_1$ to the bottom of the recess $43_2$ in the first recess 43 in the E-mode region and the distance from the bottom of the recess $44_1$ to the bottom of the recess $44_2$ in the second recess 44 in the D-mode region. For example, Vth(D) is −0.2[V], and Vth(E) is +0.2[V].

Figure 5A:
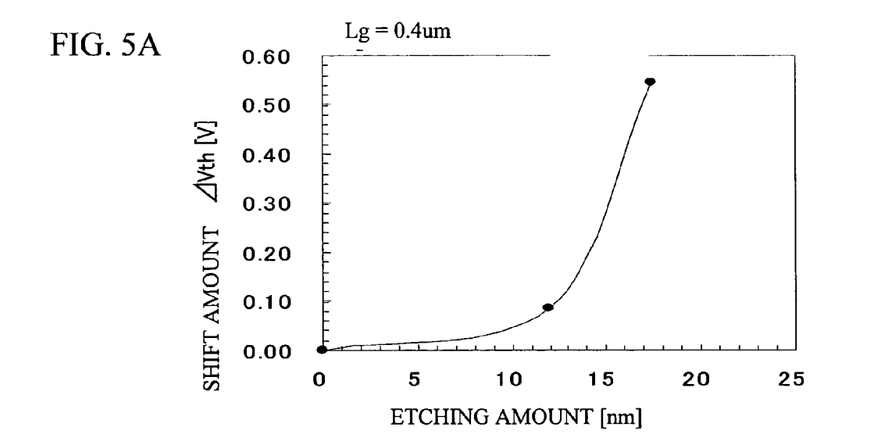
FIGS. 5A through 5C are graphs showing characteristics of the compound semiconductor device shown in FIG. 4.

As will be described later in detail, the first recess $44_1$ is formed in the D-mode region, by dry etching below the etching stopper layer 36. The first recess $43_1$ in the E-mode region is formed by dry etching as described, and in addition, the buried layer 35 is formed by wet etching. Table 1 shows data regarding the wet etching of the buried layer 35, describing the relationship of etching period, etching amount, the thickness D3 of the buried layer 35, and shift amount ΔVth of the threshold voltage Vth(D). FIG. 5A is a graph showing the etching amount of the wet etching and the shift amount ΔVth of the threshold voltage Vth(D). Here, an etching rate is 70 nanometers per minute.

TABLE 1

| Etching period [sec] | Etching amount [nanometer] | Thickness of the buried layer [nanometer] | ΔVth [V] |
|---|---|---|---|
| 0 | 0.0 | 35.0 | 0.000 |
| 10 | 11.7 | 23.3 | 0.084 |
| 15 | 17.5 | 17.5 | 0.546 |

As shown in Table 1 and FIG. 5A, the shift amount ΔVth of the threshold voltage becomes greater in the D-mode as the curve shows, by wet etching the buried layer 35 and deepening the recess $43_1$ in the E-mode region. The inventor of the present invention has found out this fact, and achieved different threshold voltages Vth(D) and Vth(E) on the single compound semiconductor substrate, by applying the above-mentioned fact.

Table 2 shows a specification of HEMT shown in FIG. 4.

TABLE 2

| Item | Thickness |
|---|---|
| Cap layer 37 | 80 nm |
| Etching stopper layer 36 | 5 nm |
| Buried layer 35 (D3) | 17.5 nm |
| Buried layer 35 (D4) | 35 nm |
| Barrier layer 34 | 13 nm |
| Supply layer 33 | 11 nm |
| First recess depth c1 (E-mode) | 102.5 nm |
| First recess depth d1 (D-mode) | 85 nm |
| Distance D | 24 nm |

Table 3 shows electric characteristics of the HEMT shown in Table 2.

TABLE 3

| Item | Unit | D-mode | E-mode |
|---|---|---|---|
| Vth | [V] | −0.220 | 0.130 |
| Gmmax | [mS/mm] | 435.0 | 470.0 |
| Ifmax | [mA/mm] | 465.0 | 375.0 |
| Ron | [Ωmm] | 1.83 | 2.26 |
| Vf | [V] | 0.68 | 0.72 |
| Vgdo | [V] | −11 | −17 |

In table 3, Gmmax denotes a maximum transconductance. Ifmax denotes a maximum drain current. Ron denotes an on-state resistance. Vf denotes a forward voltage drop. Vgdo denotes a breakdown voltage between a gate and drain. In order to obtain excellent characteristics in a radio frequency switch (RF switch), the following conditions should be satisfied. (1) Vth(D) is approximately −0.2 V. (2) The on-state resistance Ron is low. (3) The maximum drain current Ifmax is high. The HEMT having the characteristic values shown in Table 3 satisfies the above-mentioned conditions.

Figure 5B:
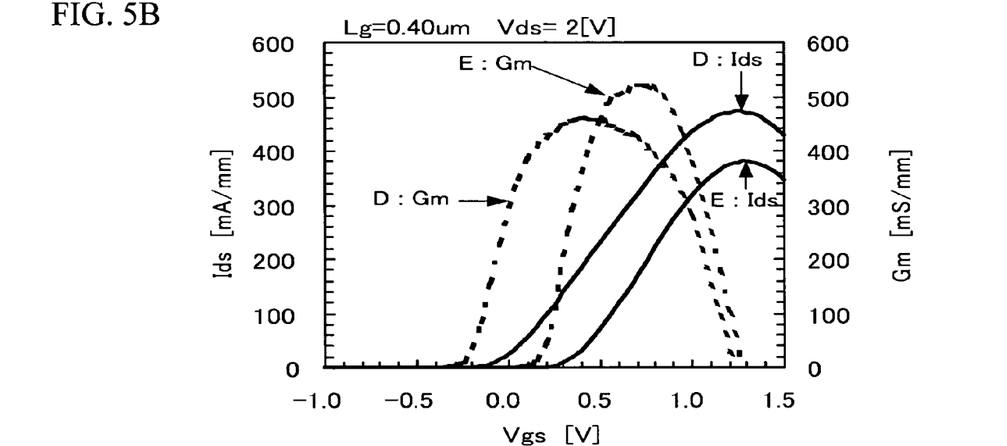
Figure 5C:
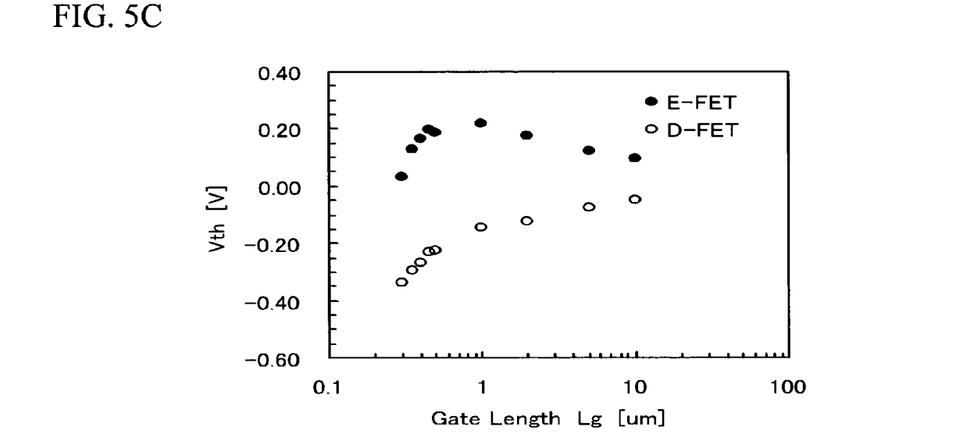

FIGS. 5B and 5C show the characteristics of the HEMT shown in FIG. 4. FIG. 5B is a graph showing the relationship of a current Ids [mA/mm] between the drain and source and transconductance Gm [mS/mm] to a voltage between the gate and source Vgs [V]. FIG. 5C is a graph showing the relationship between a gate length Lg [μm] and the threshold voltage Vth[V]. With these drawings, both the D-mode FET and the E-mode FET are fabricated on the single compound semiconductor substrate, nevertheless the required conditions can be achieved stably, in addition to the above-mentioned conditions of Vth(E) of +0.2 V and Vth(D) of −0.2 V.

Next, a description will be given of a manufacturing method of the HEMT in accordance with the first embodiment of the present invention, with reference to FIGS. 6A through 6G and FIGS. 7A though 7D.

Figure 6A:
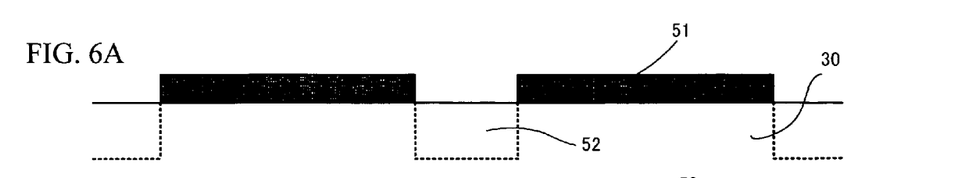
FIGS. 6A through 6G show a manufacturing method of the compound semiconductor device shown in FIG. 4.

First, referring to FIG. 6A, a patterned photoresist layer 51 is deposited on the compound semiconductor layer 30. An ion such as $B^+$ or $O^+$ ion is injected into the compound semiconductor layer 30 with the photoresist layer 51 that serves as a mask so as to arrange an isolation region 52. The isolation region 52 isolates FETs from each other. The compound semiconductor layer 30 is formed by a process for epitaxially forming the channel layer and another process for forming the buried layer on the channel layer.

Figure 6B:
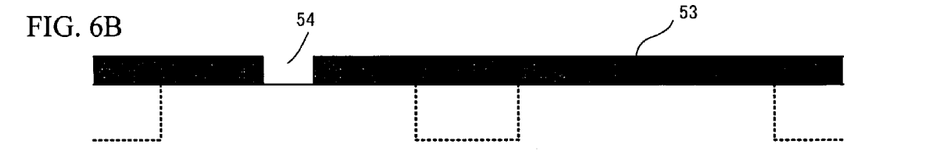

Next, referring to FIG. 6B, a photoresist layer 53 is deposited on the whole surface of the compound semiconductor layer 30. This is followed by forming a window 54 for forming the first recess $43_1$ in the E-mode region shown in FIG. 4.

Figure 6C:
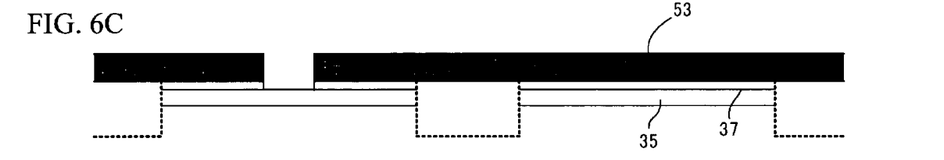

Referring to FIG. 6C, the cap layer 37 is dry etched with the photoresist layer 53 serving as the mask. The etching stopper layer 36 is removed by water washing. The surface of the buried layer 35 is exposed from an opening provided on the cap layer 37.

Figure 6D:
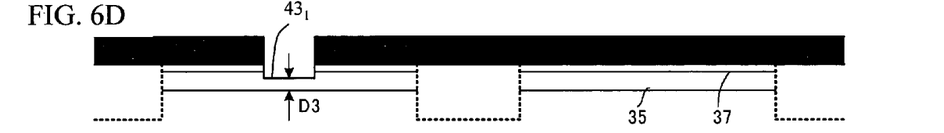

Referring to FIG. 6D, the buried layer 35 is wet etched with the photoresist layer 53 serving as the mask. This process results in an opening (the first recess $43_1$) that leads to the buried layer 35 through the cap layer 37. The buried layer 35 has the thickness D3. It is thus possible to form the recess 43 accurately by dry etching and wet etching with the same mask.

Figure 6E:
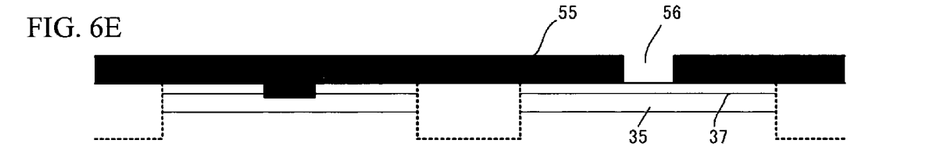

Referring to FIG. 6E, a photoresist layer 55 is deposited on the whole surface of the compound semiconductor layer 30. This is followed by forming a window 56 for forming the first recess $44_1$ in the D-mode region, shown in FIG. 4.

Figure 6F:
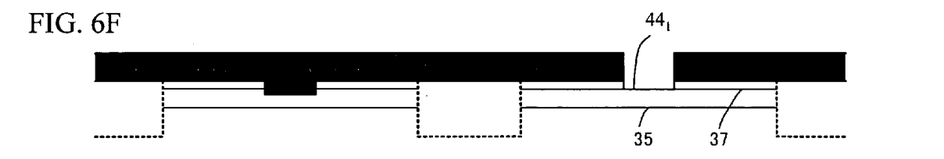

Referring to FIG. 6F, the cap layer 37 is dry etched with the photoresist layer 55 serving as the mask. The etching stopper layer 36 is removed by water washing. Another opening, which will be the recess $44_1$ in the recess 44, is provided in the cap layer 37.

Figure 6G:
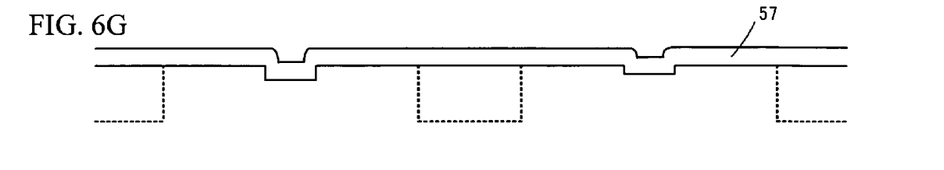

Referring to FIG. 6G, an insulation layer 57 such as $SiO_2$ is formed on the whole surface of the compound semiconductor layer 30.

Figure 7A:
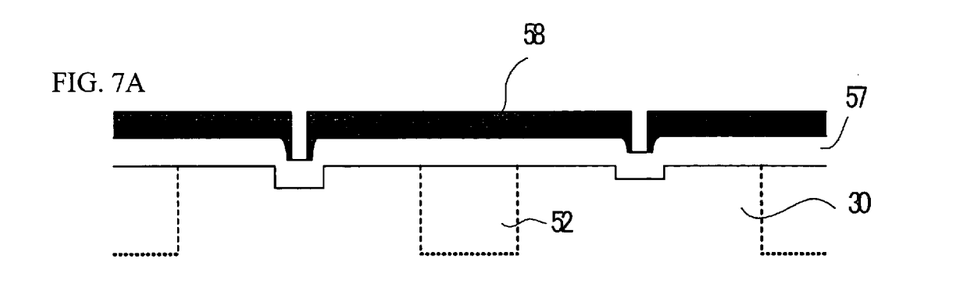
FIGS. 7A through 7D show the manufacturing method of the compound semiconductor device shown in FIG. 4 and a process that leads to FIGS. 6A.

Referring to FIG. 7A, a photoresist layer 58 for forming the gate electrode is provided on the whole surface of the compound semiconductor layer 30 to form windows at positions that correspond to the gate electrodes 38 and 39 as shown in FIG. 4.

Figure 7B:
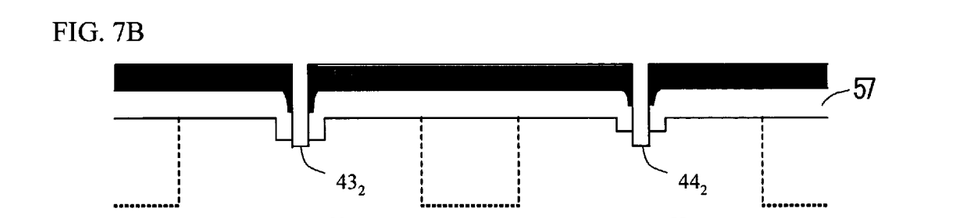

Referring to FIG. 7B, the buried layer 35 is dry etched with the photoresist layer 58 serving as the mask. Thus, the second recesses $43_2$ and $44_2$ are formed.

Figure 7C:
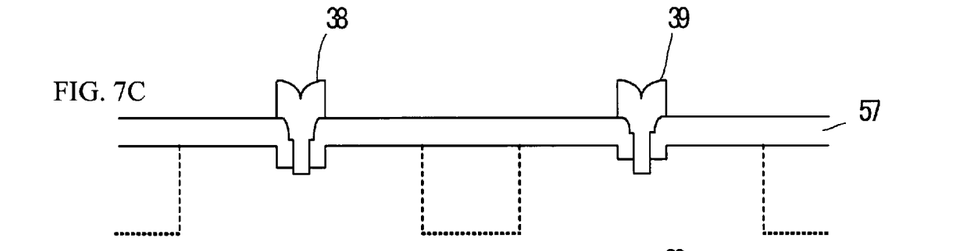

Referring to FIG. 7C, the gate electrodes 38 and 39 are formed after removing the photoresist layer 58. Preferably, the gate electrodes 38 and 39 are formed of a refractory metal. The refractory metal may, for example, be WSi (tungsten silicide), TiW, WN, TiWN, and WSiN.

Figure 7D:
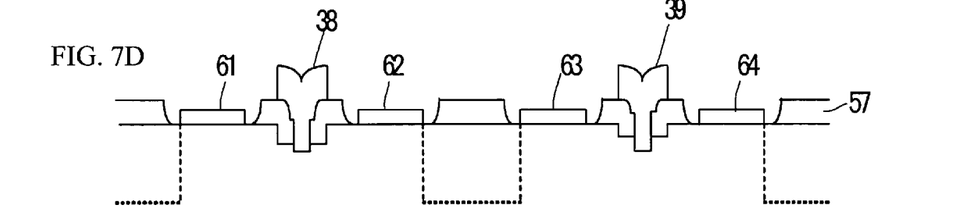

Referring to FIG. 7D, windows are formed by etching the insulation layer 57, and ohmic electrodes 61 through 64 are formed on the cap layer 37. The ohmic electrodes 61 and 62 serve as a source electrode and a drain electrode in the E-mode FET, and the ohmic electrodes 63 and 64 serve as a source electrode and a drain electrode in the D-mode FET.

The above-mentioned manufacturing method may be modified so that the step in FIG. 6F may be performed after the step in FIG. 6C, and then the step in FIG. 6D may be performed. However, the recess 43 is formed with two masks, and this causes a disadvantage in accuracy.

(Second Embodiment)

Figure 8:
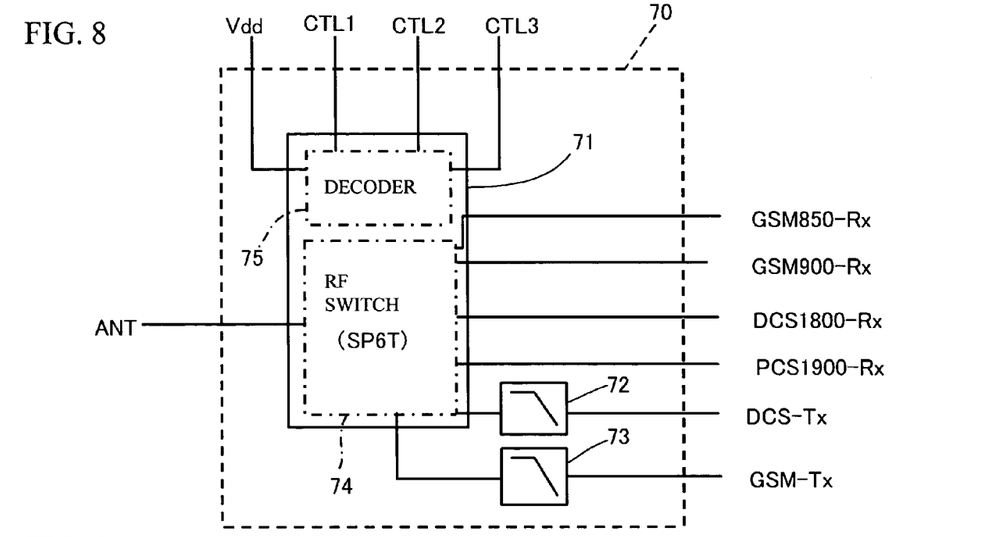
FIG. 8 is a block diagram illustrating an RF antenna switch module, which is a semiconductor device in accordance with a second embodiment of the present invention.

FIG. 8 is a block diagram illustrating a semiconductor device in accordance with a second embodiment of the present invention. The semiconductor device shown in FIG. 8 is an RF antenna switch module (hereinafter referred to as RF module), which may be employed in mobile terminal equipment. This RF module selectively connects an antenna ANT to any of multiple RF signal systems. An RF module 70 in FIG. 8 includes a semiconductor chip 71 and LPFs 72 and 73. The semiconductor chip 71 is produced with the compound semiconductor device in accordance with the present invention, and has a configuration in accordance with the first embodiment of the present invention. The semiconductor chip 71 includes an RF switch 74 and a decoder 75. The RF switch 74 has the SP6T function, which has one input (output) terminal and six output (input) terminals. The RF switch 74 selectively connects one of six RF signal systems, GSM850-Rx, GSM900-Rx, DCS1800-Rx, PCS1900-Rx, DCS-Tx, and GSM-Tx to the antenna ANT. The LPF 72 is provided for DCS-Tx. The LPF 73 is provided for GSM-Tx. The decoder 75 controls the RF switch 74 according to external control signals CTL1 through CTL3. A power supply voltage Vdd is applied to the chip 71.

The RF switch 74 with the SP6T function is required to have a high handling power Pmax, because the GSM handles the RF signals at 35 dBm. The high handling power denotes the maximum power to be handled. The handling power Pmax will be described below.

Figure 9:
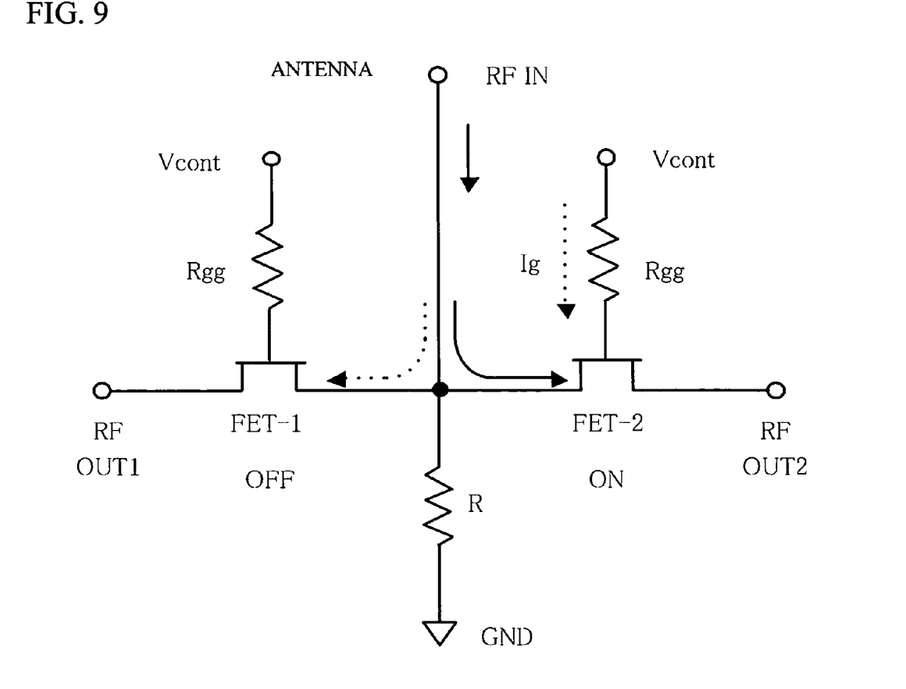
FIG. 9 is a circuit diagram showing a basic configuration of the RF switch.
Figure 10A:
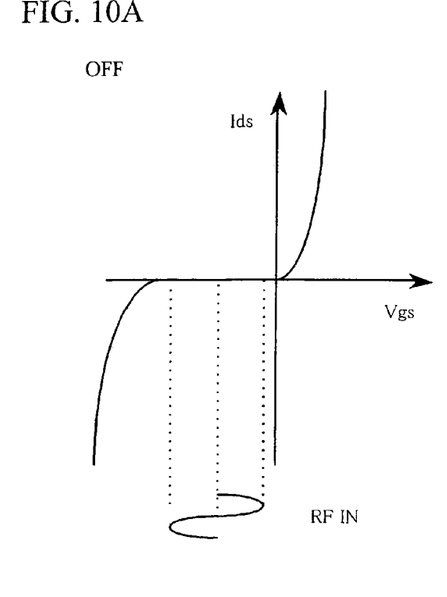
FIG. 10 is a set of two graphs showing characteristics of the RF switch operations shown in FIG. 9.
Figure 10B:
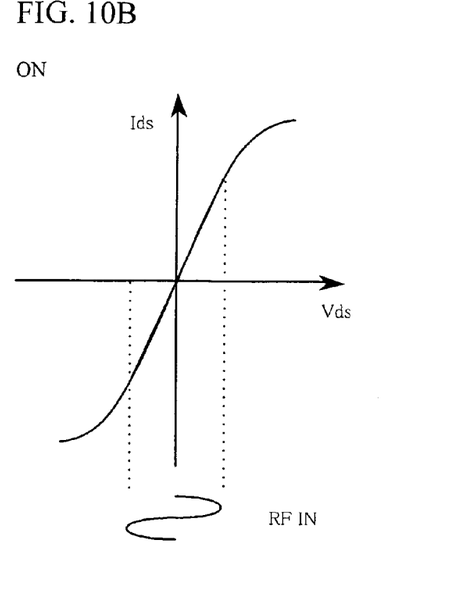

FIG. 9 is a circuit diagram showing a basic configuration of the RF switch. The RF switch has the SP6T capabilities. The following description assumes that an FET-1 is off, and an FET-2 is on. A connection node that connects the FET-1 and the FET-2 is connected to the antenna and is grounded through a resistor R. A control voltage Vcont of, for example, −2.6 V, is applied to the gate of the off-state FET-1 through a resistor Rgg. A current Ig, which is fixed by the control voltage Vcont and the resistor Rgg, is applied to the gate of the FET-2, which is then turned on. FIGS. 10A and 10B show bias states of the FET-1 and the FET-2. In these figures, Vgs denotes a voltage between the gate and source, Vds denotes the voltage between the drain and source, and Ids denotes a drain current. The RF signal on the off-state side swings about the control voltage Vcont, which may be equal to −2.6 V. The RF signal on the on-state side swings about Vds of 0 V. According to the requirements for low-voltage operation on mobile telephones, the control voltage Vcont tends to be smaller by generations.

The handling power Pmax is required to be set in consideration of the operations of the FET-1 in the off state. The positive amplitude depends on the difference between the threshold voltage Vth and the control voltage Vcont. If the maximum amplitude of the RF signal exceeds Vth, the FET-1 in the off state turns on and the FET-2 in the on state produces a distorted waveform. Thus, it is preferable that Vth and Vcont are greatly different. The negative amplitude depends on the reverse leak current on the gate. If the amplitude becomes great, a reverse leak current Ig flows and degrades the positive waveforms. It is thus preferable that the FET is divided into multiple stages so that the reverse bias voltage may be divided at the multiple stages.

Figure 11:
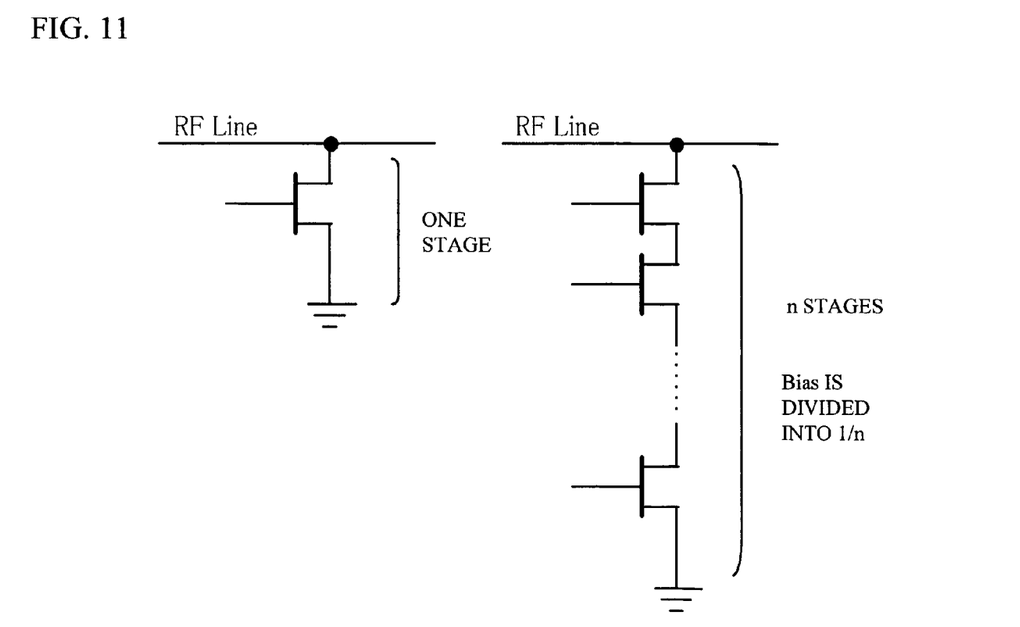
FIG. 11 shows a configuration of FETs that are divided into multiple stages.

FIG. 11 shows an n-stage FET configuration. The FET connected to a signal path is divided into n transistors so as to form the n-stage stack structure, which has n FETs connected in series. Thus, the reverse bias voltage 1/n is applied to each of the off FET-1. The RF switch can breakdown a high voltage. In this case, the handling power Pmax is described by the following expression:

$$Pmax=2[n(Vth-Vcont)]2/Zo$$

Here, n denotes the number of the stages, and Zo denotes system impedance. As seen in this expression, the handling power Pmax varies according to the threshold voltage Vth.

Figure 12:
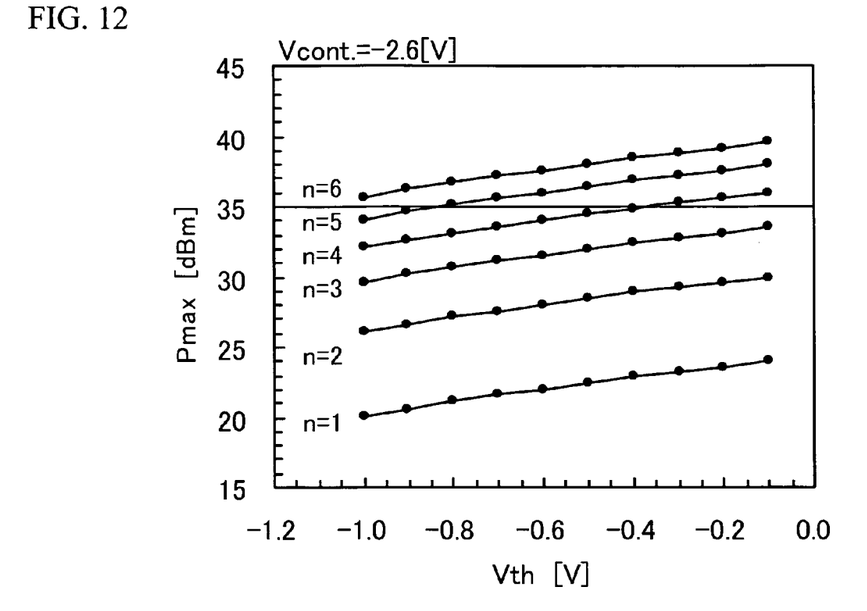
FIG. 12 is a graph showing a division number, a threshold voltage, and maximum power.

FIG. 12 shows dependency of the handling power Pmax to the threshold voltage Vth. As a division number n of stages increases, the handling power Pmax becomes greater. As the threshold voltage Vth becomes smaller, that is, close to 0 V, the handling power Pmax becomes greater. As described, according to the requirements for low-voltage operations, the control voltage Vcont of the RF switch 74 tends to be smaller. There is an advantage in that Pmax becomes greater if the threshold voltage Vth is small. In addition, the on-state resistance Ron is great in the E-mode. Therefore, there is another advantage in the insertion loss in that FETs included in the RF switch operate in the D-mode. Taking into consideration of the above-mentioned advantages totally, it is desirable that the division number should be four and the threshold voltage Vth of the FET should be −0.2 V. The insertion loss of the FET, Loss is calculated by the following expression.

$$Loss = 10 \log \left(\frac{2Zo + nRon}{2Zo}\right)^2$$

Here, Ron denotes the on-state resistance, and Zo denotes the system impedance.

The FETs used in the decoder 75 should turn off when the gate bias voltage Vg is 0 V. Therefore, the E-mode FETs are employed together with the D-mode FETs. Also, the decoder 75 is configured with DCFL (Direct Coupling FET Logic) in order to suppress the power consumption. DCFL is employed in the E-mode FET. The gate connected to the Schottky interface has a forward voltage drop Vf of 0.7 V in the E-mode. Therefore, +0.2 V of Vth(E) is required to achieve the DCFL operations.

As described, the compound semiconductor device in accordance with the first embodiment of the present invention is capable of accurately achieving Vth(D) of −0.2 V and Vth(E) of +0.2 V. As shown in FIG. 8, the RF switch 74 and the decoder 75 can be mounted on a single chip. Thus, the RF module can be downsized. Conventionally, the RF switch 74 and the decoder 75 are separately mounted on different chips, and are connected by a wire bonding. However, the above-mentioned single chip no longer has to connect the RF switch 74 and the decoder 75 by wire bonding. It is thus possible to improve the degradation of the RF characteristics caused resulting from the wire.

Table 4 shows transmission characteristics of the RF module. Table 5 shows reception characteristics of the RF module.

TABLE 4

|  | Frequency [GHz] | Insertion Loss [dB] | Harmonics 2$^{nd}$ [dBc] | 3$^{rd}$ [dBc] |
|---|---|---|---|---|
| GSM | 0.82 | 0.89 | 74.1 | 70.0 |
|  | 0.92 | 0.93 |  |  |
| DCS | 1.71 | 0.94 | 76.0 | 68.9 |
|  | 1.91 | 1.22 |  |  |

TABLE 5

|  | Frequency [GHz] | Insertion Loss [dB] | Return Loss [dB] | Isolation [dB] |
|---|---|---|---|---|
| GSM850 | 0.86 | 0.97 | 22.1 | 42.7 |
|  | 0.90 | 0.89 | 22.4 | 42.9 |
| GSM900 | 0.92 | 0.94 | 22.8 | 42.4 |
|  | 0.96 | 0.99 | 23.0 | 42.3 |
| DCS1800 | 1.80 | 1.15 | 23.9 | 46.2 |
|  | 1.88 | 1.15 | 24.2 | 44.7 |
| PCS1900 | 1.93 | 1.26 | 25.3 | 43.6 |
|  | 1.99 | 1.20 | 25.6 | 42.3 |

(Third Embodiment)

Figure 13:
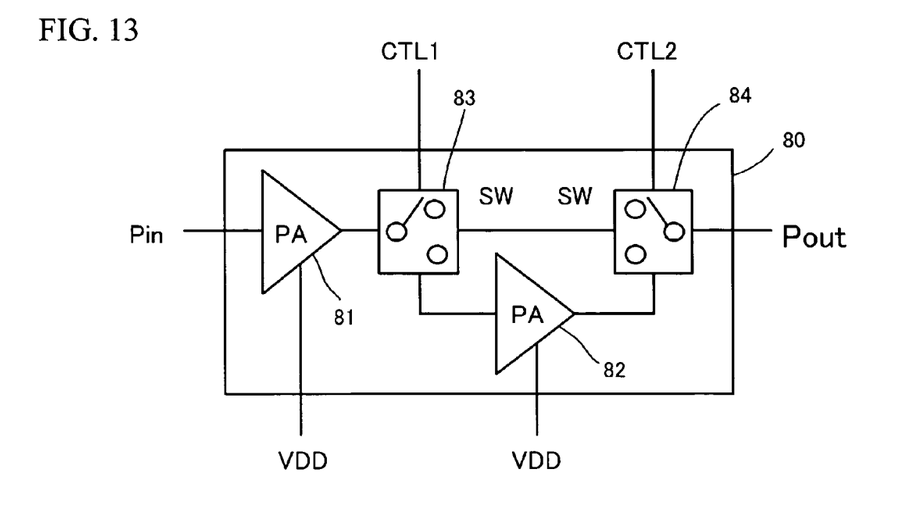
FIG. 13 is a diagram illustrating a power amp module, which is a compound semiconductor device in accordance with a third embodiment of the present invention.

FIG. 13 is a power amplifier module (PA module) in accordance with a third embodiment of the present invention. A PA module 80 includes power amplifier (PA) circuits 81 and 82 and RF switches 83 and 84. It is desirable to operate on a single power supply (Vdd), due to the requirements of mobile telephones such as low cost and downsizing. The RF switches 83 and 84 are required to include the D-mode FETs as in the RF switch 74 shown in FIG. 8. As another requirement, the power amplifiers are required to have a high breakdown voltage Vgdo between the gate and drain in order to produce high power. The breakdown voltage Vgdo is an input voltage that can transmit signals without distortion. Preferably, the barrier layer 34 shown in FIG. 4 is thick in order to achieve the high power amplifier. On the other hand, the RF switch does not need the breakdown voltage Vgdo between the gate and drain as high as the power amplifier. However, a low on-state resistance Ron is necessary. Therefore, the barrier layer 34 needs to be thinner to achieve the low on-state resistance. It is easily possible to achieve the above-mentioned requirements with high reliability, by applying the compound semiconductor device shown in FIG. 4 to the PA module 80.

Figure 14A:
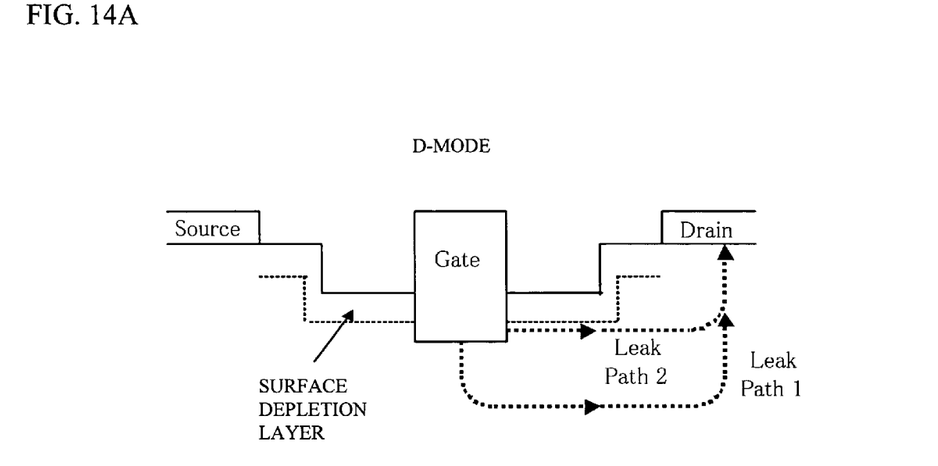
FIGS. 14A and 14B show Vgdo, a breakdown voltage between a gate and drain.
Figure 14B:
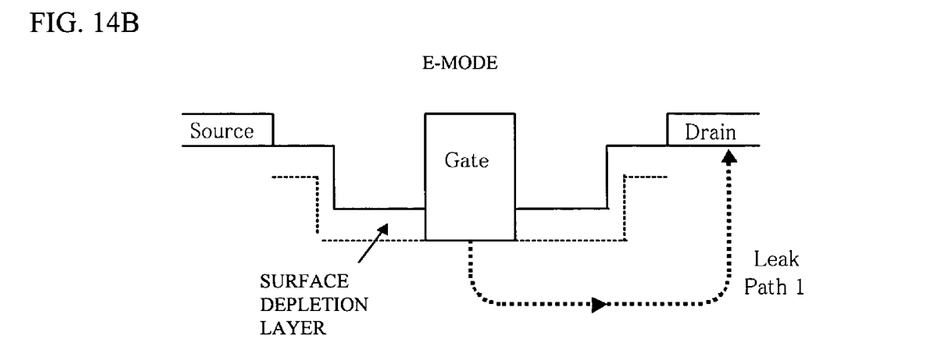

FIGS. 14A and 14B show that the breakdown voltage Vgdo between the gate and drain of the E-mode FET is higher than the breakdown voltage Vgdo of the D-mode FET. FIG. 14A shows the D-mode region, and FIG. 14B shows the E-mode region. As seen in the D-mode region, the depth of the recess is shallow, in other words, the buried layer 35 is thick, another leak current (a leak path 1) exists in addition to the original leak current (a leak path 2) passing through the Schottky interface. The leak path 2 passes through a sidewall of the gate electrode 39 embedded in the buried layer 35. On the other hand, the leak path is blocked by a surface depletion layer that extends from the recess surface, in the case where the recess is deepened (the buried layer 35 becomes thinner). Then, the threshold voltage Vth is shallow, and it is thus improve the breakdown voltage Vgdo between the gate and drain.

The PA module 80 adjusts the number of stages of FETs at the time of outputting a low output and a high output to improve the efficiency in the low output. Specifically, the switches 83 and 84 make the low-output path without the power amplifier circuit 82. If the power is low, the PA module 80 amplifies an input power Pin with a power amplifier circuit 81 only and outputs an output power Pout. If the power is high, the PA module 80 amplifies the input power Pin with power amplifier circuits 81 and 82. The RF switches 84 and 85 are controlled by control signals CTL1 and CTL2.

In accordance with the third embodiment of the present invention, it is possible to suppress the breakdown voltage Vgdo to −11 V and obtain an on-state resistance Ron of 1.8

Ωmm in the D-mode. It is also possible to achieve a breakdown voltage Vgdo of −17 V and obtain an on-state resistance Ron of 2.1 Ωmm in the E-mode, where Vg is 0.8 V, which has an effect on the efficiency of the power amplifier. An MMIC can be obtained by using a spiral inductor and an MIM capacitor together with the one-chip PA module 80. The spiral inductor is used as a passive component that is used for a matching circuit. It is thus possible to realize the PA module on one chip, although the PA module was conventionally composed of discrete parts.

The present invention is not limited to the above-mentioned embodiments, and other embodiments, variations and modifications may be made without departing from the scope of the present invention.

The present invention is based on Japanese Patent Application No. 2004-009877 filed on Jan. 16, 2004, the entire disclosure of which is hereby incorporated by reference.

What is claimed is:

1. A semiconductor device comprising:
   a compound semiconductor substrate;
   a channel layer provided on the compound semiconductor substrate;
   a buried layer provided on the channel layer;
   a first recess formed in the buried layer in an E-mode region;
   a second recess formed in the first recess in the E-mode region and another second recess formed in the buried layer in a D-mode region; and
   a gate electrode provided in the second recess in the E-mode region and another gate electrode provided in said another second recess in the D-mode region,
   wherein a distance between a surface of the buried layer and a bottom of the second recess in the E-mode region is shorter than another distance between another surface of the buried layer and a bottom of said another second recess in the D-mode region, and
   wherein a distance between the bottom of the second recess and the channel layer in the E-mode region is identical to another distance between the bottom of said another second recess and the channel layer in the D-mode region.

2. The semiconductor device as claimed in claim 1, further comprising:
   a cap layer provided on the buried layer; and
   another first recess formed in the cap layer in the D-mode region,
   wherein the first recess is formed in the buried layer and the cap layer in the E-mode region; and
   wherein the first recess in the E-mode region is deeper than said another first recess in the D-mode region.

3. The semiconductor device as claimed in claim 1, further comprising a supply layer provided on the channel layer, the supply layer forming a two-dimensional electron gas in the channel layer.

4. The semiconductor device as claimed in claim 1, further comprising an RF switch circuit and a logic circuit, the RF switch circuit using an FET in the D-mode region, and the logic circuit including another FET in the E-mode region.

5. The semiconductor device as claimed in claim 1, further comprising an RF switch circuit and a power amplifier circuit, the RF switch circuit using an FET in the D-mode region, and the power amplifier circuit including another FET in the E-mode region.

6. The semiconductor device as claimed in claim 1, wherein an FET in the E-mode region has a higher breakdown voltage between a gate and drain than another breakdown voltage between a gate and drain in the D-mode region.

* * * * *